United States Patent
Tsai et al.

(10) Patent No.: US 6,636,139 B2
(45) Date of Patent: Oct. 21, 2003

(54) STRUCTURE TO REDUCE THE DEGRADATION OF THE Q VALUE OF AN INDUCTOR CAUSED BY VIA RESISTANCE

(75) Inventors: Chaochieh Tsai, Hsin-Chu (TW); Shyh-Chyi Wong, Taichung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 8 days.

(21) Appl. No.: 09/950,224

(22) Filed: Sep. 10, 2001

(65) Prior Publication Data

US 2003/0076209 A1 Apr. 24, 2003

(51) Int. Cl.[7] ................................................ H01F 5/00
(52) U.S. Cl. ........................................ 336/200; 438/637
(58) Field of Search ................................ 336/200, 223, 336/232; 257/774, 758; 438/637, 618

(56) References Cited

U.S. PATENT DOCUMENTS

| | | | |
|---|---|---|---|
| 5,478,773 A | 12/1995 | Dow et al. | 437/60 |
| 5,539,241 A | 7/1996 | Abidi et al. | 257/531 |
| 6,027,999 A * | 2/2000 | Wong | 438/637 |
| 6,054,329 A | 4/2000 | Burghartz et al. | 438/3 |
| 6,355,535 B2 * | 3/2002 | Liou | 438/381 |
| 6,396,153 B2 * | 5/2002 | Fillion et al. | 257/774 |
| 6,437,418 B1 * | 8/2002 | Ferrari et al. | 257/531 |
| 6,489,656 B1 * | 12/2002 | Lin | 257/359 |

\* cited by examiner

*Primary Examiner*—Anh Mai
(74) *Attorney, Agent, or Firm*—George O. Saile; Stephen B. Ackerman

(57) ABSTRACT

A new method and structure is provided to connect a planar, spiral inductor to underlying interconnect metal, the interconnect metal has been created over a semiconductor surface. A layer of dielectric followed by a layer of passivation is deposited over the semiconductor surface, including the surface of the underlying interconnect metal. Large first vias are created through the layers of passivation and dielectric. The large first vias align with the patterned interconnect metal, providing low-resistivity points of interconnect between the spiral inductor, which is created on the surface of the layer of passivation concurrent with the creation of the large first vias, and the patterned interconnect metal. A thick layer of polyimide is deposited over the surface of the layer of passivation, including the surface of the spiral inductor and the large first vias. The invention can further be extended by creating at least one second via through the thick layer of polyimide aligned with at least one of the created first vias. A patterned and etched layer of metal that fills the second via creates a re-distribution layer on the surface of the thick layer of polyimide for flip chip interconnects.

22 Claims, 2 Drawing Sheets

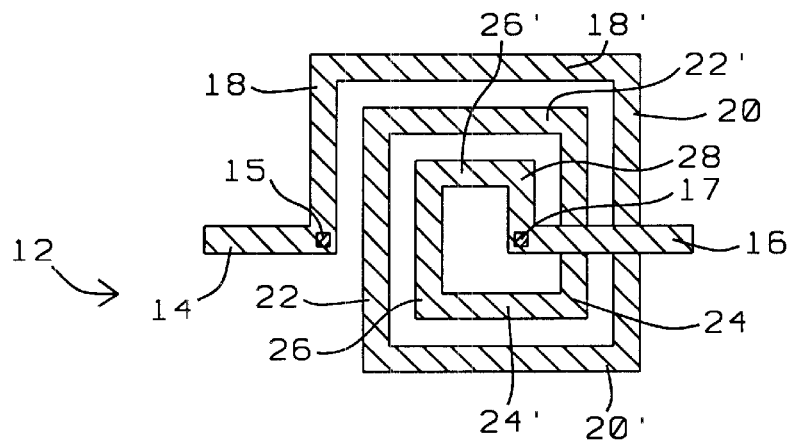
FIG. 1 – Prior Art
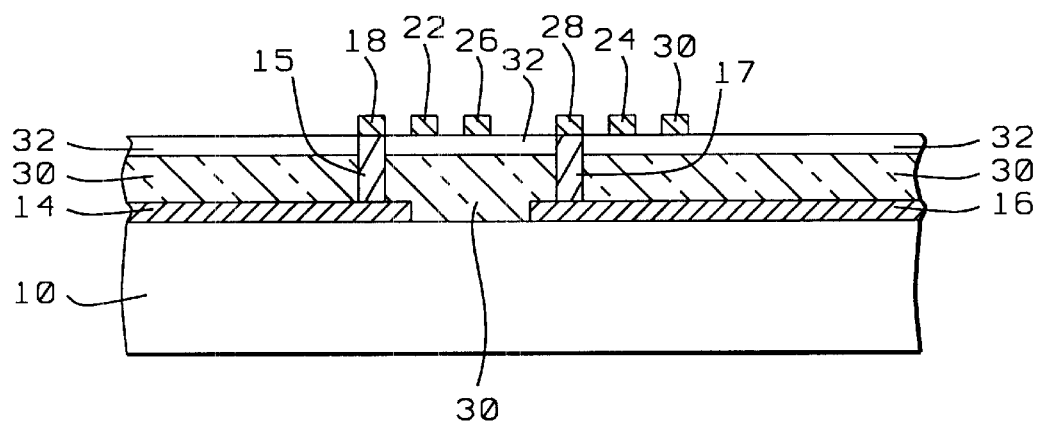
FIG. 2 – Prior Art
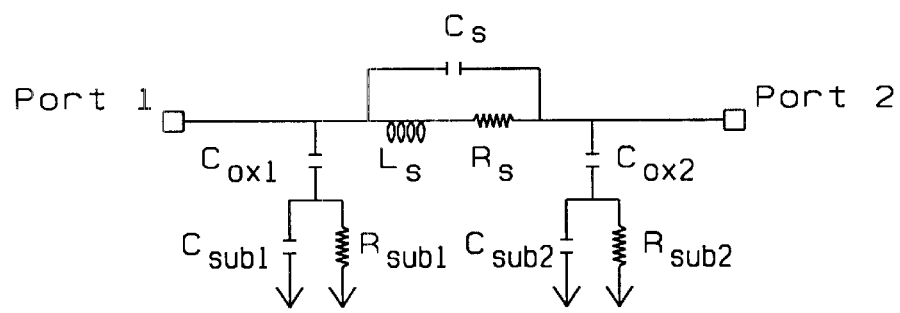
FIG. 3

STRUCTURE TO REDUCE THE DEGRADATION OF THE Q VALUE OF AN INDUCTOR CAUSED BY VIA RESISTANCE

BACKGROUND OF THE INVENTION (1) Field of the Invention

The invention relates to the fabrication of integrated circuit devices, and more particularly, to a method and structure of creating an inductor as part of a semiconductor device in such a manner that a negative impact of via resistance is sharply reduced.

(2) Description of the Prior Art

Integrated Circuits (IC's) are typically formed in or on the surface of a semiconductor substrate, electrical circuit elements of the individual IC's are connected internally to the semiconductor surface on which the IC's are formed. IC's that are formed in or on the surface of a substrate are mostly active digital processing devices but can also include analog processing devices. In addition, discrete passive components can be formed that function with active semiconductor devices and that are preferably created using semiconductor device technology procedures and equipment.

One of the major challenges in the creation of analog processing circuitry using digital processing procedures and equipment is that a number of components used for analog circuitry are large in size and are therefore not easy to integrate into devices that typically have feature sizes approaching the sub-micron range. The main components that offer a challenge in this respect are capacitors and inductors, both these components are, for typical analog processing circuitry, of considerable size.

A typical application of an inductor is in the field of modern mobile communication that makes use of compact high-frequency equipment. Continued improvements in the performance of such equipment place continued emphasis on lowering the power consumption of the equipment, on reducing the size of the equipment, on increasing the frequency of the applications and on creating low noise levels.

Typically, inductors that are created on the surface of a substrate are of a spiral shape whereby the spiral is created in a plane that is parallel with the plane of the surface of the substrate. Conventional methods that are used to create the inductor on the surface of a substrate suffer several limitations. Most high Q inductors form part of a hybrid device configuration or of Monolithic Microwave Integrated Circuits (MMIC's) or are created as discrete components, the creation of which is not readily integratable into a typical process of Integrated Circuit manufacturing.

The parameter by which the applicability of an inductor is typically indicated is the Quality (Q) factor of the inductor. The quality factor Q of an inductor is defined as $Q = Es/El = F_0 L/R$ wherein Es is the energy that is stored in the reactive portion of the component, El is the energy that is lost in the reactive portion of the component, $F_0$ is the resonant frequency of oscillation of the resonant circuit of which the inductor is a component, L is the inductance of the inductor and R is the resistance of the inductor. The higher the quality of the component, the closer the resistive value of the component approaches zero while the Q factor of the component approaches infinity. The quality factor Q is dimensionless. A Q value of greater than 100 is considered very high for discrete inductors that are mounted on the surface of Printed Circuit Boards. For inductors that form part of an integrated circuit, the Q value is typically in the range between about 3 and 10.

In typical applications, the redistribution inductor, created in a plane that is parallel with the surface of the substrate over which the inductor is created, has very low serial resistance. However, the conventional via that is provided between the inductor and the underlying metal contributes a finite value of resistance which forms a barrier in the effort to reduce the resistive value of the inductor and to thereby improve the Q value of the inductor. The invention addresses this concern in the creation of a planar inductor.

U.S. Pat. No. 6,054,329 (Burghartz et al.) shows a spiral inductor.

U.S. Pat. No. 5,539,241, (Adidi et al.) and U.S. Pat. No. 5,478,773 (Dow et al.) show related spiral inductors and via processes.

SUMMARY OF THE INVENTION

A principle objective of the invention is to reduce the resistive component of a spiral inductor.

A new method and structure is provided to connect a planar, spiral inductor to underlying interconnect metal, the patterned interconnect metal has been created over a semiconductor surface. A layer of dielectric followed by a layer of passivation is deposited over the semiconductor surface, including the surface of the underlying interconnect metal. Large first vias are created through the layers of passivation and dielectric. The large first vias align with the patterned interconnect metal, providing low-resistivity points of interconnect between the spiral inductor, which is created on the surface of the layer of passivation concurrent with the creation of the large first vias, and the patterned interconnect metal. A thick layer of polyimide is deposited over the surface of the layer of passivation, including the surface of the spiral inductor and the large first vias. The invention can further be extended by creating at least one second via through the thick layer of polyimide aligned with at least one of the created first vias. A patterned and etched layer of metal that fills the second via creates a re-distribution layer on the surface of the thick layer of polyimide for flip chip interconnects.

BRIEF DESCRIPTION OF THE DRAWINGS

FIG. 1 shows a top view of a conventional spiral inductor.

FIG. 2 shows a cross section of the conventional spiral inductor of FIG. 1.

FIG. 3 shows the electrical equivalency circuit of a spiral inductor.

DESCRIPTION OF THE PREFERRED EMBODIMENTS

Figure 4:
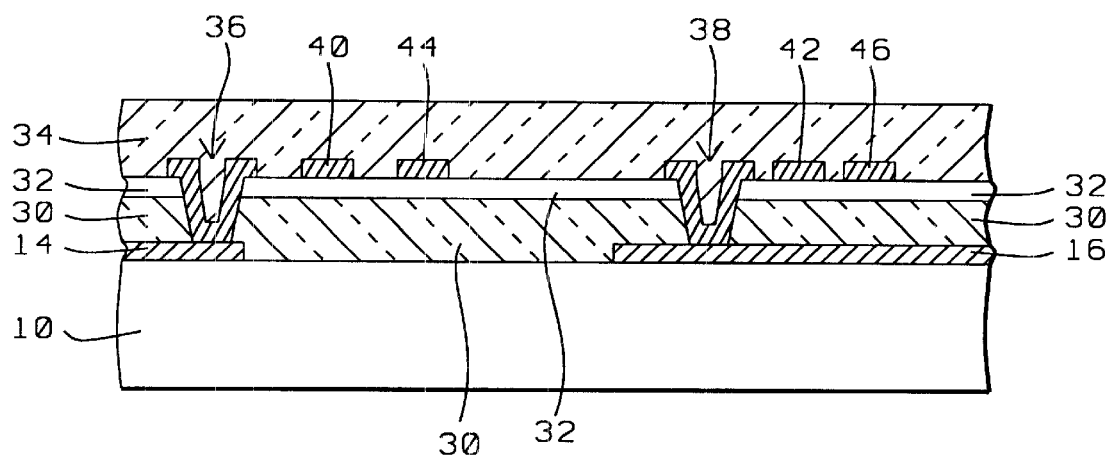
FIG. 4 shows the inductor of the invention, including the large first vias that have been used to connect the inductor to the underlying patterned interconnect metal.

Referring now specifically to FIG. 1, there is shown a top view of a spiral inductor 12 that has been created overlying the surface of a semiconductor substrate. All the lines that form the spiral inductor have been highlighted in order to facilitate cross referencing with the cross section of this inductor that is shown in FIG. 2. The spiral inductor of FIG. 1 can be recognized as having two and a half loops, the inductor that is shown in top view in FIG. 1 is connected to surrounding circuitry elements (not shown in FIG. 1) by means of the patterned interconnect metal lines 14 and 16. The highlighted elements 15 and 17 are two vias that provide the electrical connection between the (arbitrarily designated as) first line 18 of the inductor and the underlying line 14, via 17 performs this function for the electrical interconnection between the (arbitrarily designated as) last leg 28 of the inductor and the underlying line 16.

The current flow through the inductor can be identified as flowing from line 14 through via 15 through successively lines 18, 18', 20, 20', 22, 22', 24, 24', 26, 26', 28, the via 17 and out through the underlying patterned line 16. The indicated direction of current flow is arbitrary and can be reversed from the sequence that has been highlighted.

It must be noted that conventional design uses a metal thickness for the layer of the spiral inductor, that is the height of for instance the first line 18, and other lines of inductor 12 such as lines 20, 22, 24, 26 and 28 and their interconnecting lines, of about 2 μm. This observation will be used as one of the means by which the resistive component of the inductor will be reduced, this will be further discussed under FIGS. 3 and 4 following. It must further be noted that vias 15 and 17 shown in cross section in FIG. 2 are of conventional design, having a relatively small diameter in addition to having vertical sidewalls of the openings in which the vias are created.

All the other elements that have been highlighted in FIG. 2 have previously been discussed under FIG. 1 and do therefore not need to be further discussed at this time.

It must be noted that conventional design uses a metal thickness for the layer of the spiral inductor, that is the height of the elements 18, 20, 22, 24, 26 and 28, of about 2 μm. This observation will be used as one of the means by which the resistive component of the inductor will be reduced, this will be further discussed under FIGS. 3 and 4 following. It must further be noted that vias 15 and 17 shown in cross section in FIG. 2 are of conventional design, having a relatively small diameter in addition or having vertical sidewalls of the openings in which the vias are created.

The elements that are shown in FIG. 3 represent an equivalent circuit diagram of the spiral inductor of FIGS. 1 and 2. The components that make up this equivalent circuit can be described as follows:

Ls is the inductive value of the spiral inductor between the top surface of vias 15 and 17, FIGS. 1 and 2

Rs is the resistive value of the spiral inductor between the top surface of vias 15 and 17, FIGS. 1 and 2

Cs is the parasitic capacitance of the spiral inductor between the top surface of vias 15 and 17, FIGS. 1 and 2

Cox1 is the cumulative parasitic capacitance between the top surface of via 15 and the surface of the substrate 10, incurred in the layer 32 of passivation, the layer 30 of dielectric and the interconnect metal line 14

Cox2 is the cumulative parasitic capacitance between the top surface of via 17 and the surface of the substrate 10, incurred in the layer 32 of passivation, the layer 30 of dielectric and the interconnect metal line 16

Csub1 is the cumulative parasitic capacitance between the lower terminal of Cox1 on the surface of substrate 10 and circuit ground (not shown in FIGS. 1 and 2)

Csub2 is the cumulative parasitic capacitance between the lower terminal of Cox2 on the surface of substrate 10 and circuit ground (not shown in FIGS. 1 and 2)

Rsub1 is the cumulative resistance between the lower terminal of Cox1 on the surface of substrate 10 and circuit ground (not shown in FIGS. 1 and 2)

Rsub2 is the cumulative resistance between the lower terminal of Cox2 on the surface of substrate 10 and circuit ground (not shown in FIGS. 1 and 2).

For the equivalent circuit configuration that is shown in FIG. 3, the following relation is valid:

Total Rs=Rs-metal+Rc-via, where Rs-metal is the series resistance of the coils of the inductor between vias 15 and 17 on the surface of the layer 32 of passivation and Rc-via is the series resistance of the vias 15 and 17.

This value of Total Rs is the total resistive component of the spiral inductor that has previously been highlighted, it is clear that the lines (or windings) of the inductor plus the resistance of the via contribute to this total resistivity, this in accordance with the relation as shown.

Empirical experiments have shown that, after the thickness of the metal that is used to create the spiral inductor, that is the height of the lines that form the inductor as measured in a direction that is perpendicular to the surface of the underlying substrate 10, is increased from a typical (prior art) value of 2 μm to between about 6 and 26 μm, the following relationship becomes valid: Total Rs=(Rs-metal)/13+Rc-via. The factor 13 is derived from the fact that 26 (the new height) divided by 2 (the prior art height) yields the value 13. It is clear from this equation that the resistive component of the metal of the inductor has been significantly decreased as a contributing factor to the Total Rs, which results in the component Rc-via becoming the dominant factor in determining the value for Total Rs. It therefore stands to reason that, if this contributing component of Rc-via is reduced, the value for Total Rs is further reduced. By therefore using a large via, the value of Rc-via will approach zero and the value of Rs approaches (Rs-metal)/13.

The method of the invention to accomplish this is shown in cross section in FIG. 4. The new elements that are highlighted in FIG. 4 are the following:

vias 36 and 38, which take the place of the conventional vias 15 and 17 of FIG. 2 metal lines 40, 42, 44 and 46 which take the place of conventional metal lines 22, 24, 26 and 20 respectively 34, a thick layer of polyimide that has been deposited over the surface of the layer 32 of passivation, including the surface of the spiral inductor.

It must be noted from the cross section that is shown in FIG. 4 that:

the height of the lines 40, 44, 42 and 46 has been increased from (a prior art value of) 2 μm to between about 6 and 26 μm the preferred material for the metal lines 40, 44, 42 and 46 of the spiral inductor is gold or copper or platinum, to be deposited using methods of metal plating or screen printing the height of the borders of vias 36 and 38 (those portions of the vias that overlay the surface of layer 32 of passivation) also has been increased from (a prior art value of) 2 μm to between about 6 and 26 μm vias 36 and 38 are significantly more robust than the (prior art) vias 15 and 17 of FIG. 2, thereby reducing the contributing resistive component of these interconnect vias; the top surface of vias 36 and 38 of the invention have typical dimensions of about 7×7 μm, this as opposed to conventional values, which are typically used for lower levels of metal, of 0.17×0.17 μm layer 34 of polyimide can be deposited to a thickness between about 30 and 40 μm, resulting in a significant spacing between the spiral inductor and additional components (not shown in FIG. 4) that may be created overlying the surface of layer 34.

The vias 36 and 38 of the invention can be quantified as having a diameter between about 3 and 40 μm. An optimum relationship between the thickness of layer 30 of dielectric and the vias 36 and 38 can be achieved by having a ratio of via diameter to thickness of layer 30 in the range of about 0.5 and 2.0.

Figure 5:
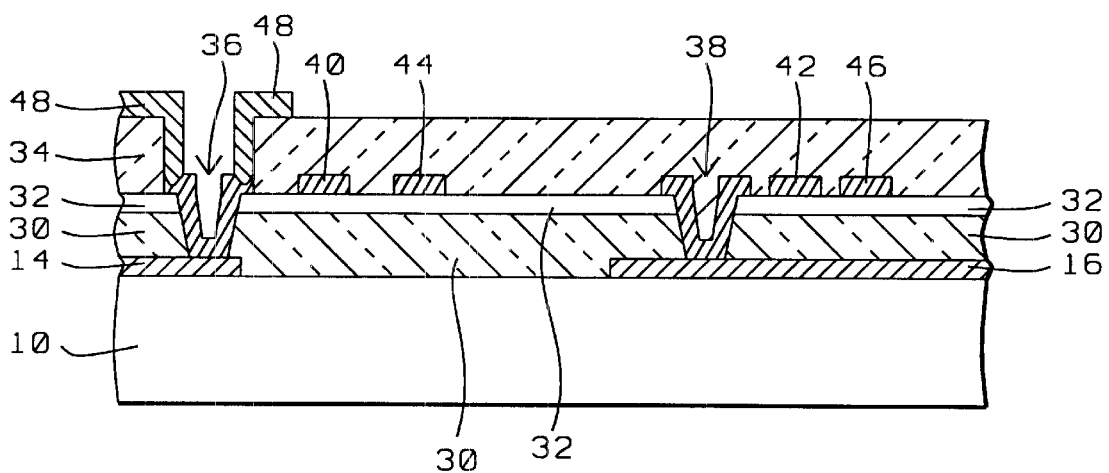
FIG. 5 shows the inductor of the invention whereby a first via that is used for the interconnect of the inductor is extended by a second via to form a re-distribution layer for flip chip application.

The creation of the spiral inductor of the invention can further be extended making use of the thick layer of polyimide as is shown in cross section in FIG. 5. Shown in FIG. 5 is how the via 36, FIG. 4, has been extended through the layer 34 of polyimide such that the border of via 48 is available for further interconnect, and can in this manner be used for instance as a redistribution layer for flip chip interconnects.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating a spiral inductor, comprising the steps of:

providing a substrate, interconnect lines having been provided over said substrate for connection thereto of inductor terminals;

depositing a layer of dielectric over said substrate, thereby including said interconnect lines;

depositing a layer of passivation over said layer of dielectric;

patterning said layer of dielectric and said layer of passivation, creating first via openings through said layers of dielectric and passivation aligned with said interconnect lines, exposing the surface of said interconnect lines;

depositing a first layer of metal over said layer of passivation, including inside surfaces of said first via openings, said first layer of metal being deposited to a thickness between about 6 and 26 μm;

patterning and etching said deposited first layer of metal, creating metal lines for an inductor, further creating first vias for interconnecting said inductor to said exposed surfaces of said interconnect lines, said first vias being connected to said inductor and forming terminal ports for said inductor, said first vias having a surface area overlying said layer of passivation larger than about 0.17×0.17 μm; and depositing a layer of polyimide over said layer of passivation, including said created inductor and inside surfaces of said created first vias.

2. The method of claim 1 wherein said layer of polyimide is deposited to a thickness between about 30 and 60 μm.

3. The method of claim 1 wherein said first vias have a surface area overlying said layer of passivation of about 7×7 μm.

4. The method of claim 1 wherein said first vias have a surface area overlying said layer of passivation larger than about 7×7 μm.

5. The method of claim 1 wherein said first layer of metal is deposited using plating or screen printing techniques.

6. The method of claim 1 wherein said first layer of metal is gold, copper or platinum.

7. The method of claim 1 with additional steps of:

creating at least one opening through said layer of polyimide, said at least one opening being aligned with at least one of said first vias;

depositing a second layer of metal over said layer of polyimide, including inside surfaces of said at least one opening created through said layer of polyimide, said second layer of metal being deposited to a thickness between about 6 and 26 μm; and patterning said second layer of metal, creating at least one second via being aligned with at least one of said first vias, providing a re-distribution layer on said layer of polyimide for flip chip interconnects.

8. The method of claim 7 wherein said second via has a surface area overlying said layer of polyimide of about 7×7 μm.

9. The method of claim 7 wherein said second via has a surface area overlying said layer of polyimide larger than about 7×7 μm.

10. The method of claim 7 wherein said second layer of metal is deposited using plating or screen printing techniques.

11. The method of claim 7 wherein said second layer of metal is gold, copper or platinum.

12. The method of claim 7 wherein said second via has a surface area overlying said layer of polyimide larger than about 0.17×0.17 μm.

13. The structure of a spiral inductor, comprising:

a substrate, interconnect lines over said substrate for connection thereto of inductor terminals;

a layer of dielectric over said substrate, thereby including said interconnect lines;

a layer of passivation over said layer of dielectric;

first via openings through said layers of dielectric and passivation aligned with said interconnect lines, exposing said interconnect lines, said first via openings being large enough for deposition of a layer of metal with a thickness between about 6 and 26 μm over inside surfaces of said first vias;

a first layer of metal over said layer of passivation, including inside surfaces of said first via openings created through said layers of passivation and dielectric, said first layer of metal having a thickness between about 6 and 26 μm;

said deposited first layer of metal having been patterned and etched, creating metal lines for an inductor, further creating first vias for interconnect said inductor to said exposed surfaces of said interconnect lines, said first vias being connected to said inductor and forming terminal ports for said inductor, said first vias having a surface area overlying said layer of passivation larger than about 0.17×0.17 μm; and a layer of polyimide deposited over said layer of passivation, including said created inductor and inside surfaces of said created first vias.

14. The structure of claim 13, said layer of polyimide having a thickness between about 30 and 60 μm.

15. The structure of claim 13, said first via having a surface area overlying said layer of passivation of about 7×7 μm.

16. The structure of claim 13, said first via having a surface area overlying said layer of passivation larger than about 7×7 μm.

17. The structure of claim 13, wherein said first layer of metal is gold, copper or platinum.

18. The structure of claim 13 with the addition of:
at least one opening created through said layer of polyimide, said at least one opening being aligned with at least one of said first vias;
a second layer of metal deposited over said layer of polyimide, including inside surfaces of said at least one opening created through said layer of polyimide, said second layer of metal being deposited to a thickness between about 6 and 26 $\mu$m; and
at least one second via created through said layer of polyimide aligned with at least one of said first vias, providing a re-distribution layer on said layer of polyimide for flip chip interconnects.

19. The structure of claim 18, said at least one second via having a surface area overlying said layer of polyimide of about 7×7 $\mu$m.

20. The structure of claim 18, said at least one second via having a surface area overlying said layer of polyimide larger than about 7×7 $\mu$m.

21. The structure of claim 18, wherein said second layer of metal is gold, copper or platinum.

22. The structure of claim 18, said at least one second via having a surface area overlying said layer of polyimide larger than about 0.17×0.17 $\mu$m.

* * * * *